United States Patent
Choi

[11] Patent Number: 5,299,011
[45] Date of Patent: Mar. 29, 1994

[54] METHOD OF AND APPARATUS FOR CHANNEL SCANNING

[75] Inventor: Sung G. Choi, Seoul, Rep. of Korea

[73] Assignee: SamSung Electronics Co., Ltd., Suwon, Rep. of Korea

[21] Appl. No.: 456,861

[22] Filed: Dec. 27, 1989

[30] Foreign Application Priority Data

May 26, 1989 [KR] Rep. of Korea .............. 89-7180

[51] Int. Cl.$^5$ .................................. H04N 5/50
[52] U.S. Cl. ............................. 348/731; 348/731; 455/184.1; 455/186.1
[58] Field of Search .......... 358/191.1, 193.1, 194.1; 455/185, 186, 182, 183, 184; H04N 5/44, 5/50

[56] References Cited

U.S. PATENT DOCUMENTS

| | | | |
|---|---|---|---|
| 4,271,434 | 6/1981 | Sakamoto | 358/193.1 |
| 4,357,632 | 11/1982 | French | 358/193.1 |
| 4,364,094 | 12/1982 | French | 358/193.1 |
| 4,397,038 | 8/1983 | Rzeszewski | 358/193.1 |
| 4,429,415 | 1/1984 | Chin | 358/193.1 |
| 4,451,850 | 5/1984 | Camemoto | 455/183 |
| 4,594,611 | 6/1986 | Sugibayashi | 455/192 |
| 4,763,195 | 8/1988 | Tults | 455/182 |

*Primary Examiner*—Tommy P. Chin
*Attorney, Agent, or Firm*—Robert E. Bushnell

[57] ABSTRACT

A channel scanning method for reducing scanning time of a channel in automatic channel memory of TV, VCR, or other video appliance is disclosed. To reduce the scanning time, a microcomputer detects synchronization signals for 300 ms after transmitting frequency data for broadcasting channel to tuner and the micom detects synchronization signals for 30 ms per step in dropping frequency data. The synchronization signal detecting time is 360 ms and is shorter than the prior time of 780 ms.

17 Claims, 3 Drawing Sheets

5,299,011

METHOD OF AND APPARATUS FOR CHANNEL SCANNING

BACKGROUND OF THE INVENTION

1. Field of the Invention

The present invention is related to a method of automatic programming by which the channels where broadcasting signals exist are automatically searched and memorized in VTR or TV etc, and especially to a channel scanning method which reduces the scanning time of the whole channel to have the automatic program be completed in a shorter time.

2. Description of the Prior Art

Recently, as the use of cable TV has spread, the number of receivable broadcasting channels has increased rapidly. Because increase of scanning time of the whole channel is caused by the increase in the number of the broadcasting channels, the execution time of the automatic program which memorizes and programs the broadcasting channels needs more time.

FIG. 2 is a change view of tuning frequency to illustrate the traditional method of channel scanning.

With FIG. 2, the traditional method of channel scanning is looked into.

The frequency data fo of a specific channel is transmitted to the tuner by the micom.

Then, for 300 ms after transmission of the frequency data fo, the synchronizing signal is detected.

At this time, if the synchronizing signal is not detected, the detection of the synchronizing signal is continued with the frequency data being increased 8 steps each of 0.25 MHz.

That is, if the synchronizing signal is not detected in 300 ms after transmission of frequency data fo, the frequency data is increased 0.25 MHz and the synchronizing signal is detected for 30 ms.

If the synchronizing signal is not detected at this time, too, the frequency data is again increased 0.25 MHz and synchronizing signal is detected for 30 ms.

Such a detection of the synchronizing signal is continued until the frequency data is fo+2 MHz, the frequency data is decreased to fo 2 MHz.

And then, the synchronizing signal is detected for 30 ms per each step with the frequency data being increased 8 steps each fo 0.25 MHz once.

If the synchronizing signal is detected while the synchronizing signal is detected in this way, the channel of that frequency is judged as the channel in which the broadcasting exists and memorized by micom. In succession, the synchronizing signal of the next channel is detected.

As mentioned above, when the synchronizing signal is detected by the traditional channel scanning method, the synchronizing signal detection time consumed per a channel is 780 ms as shown in FIG. 2.

Hence, much time is needed to scan the whole channel.

Especially, there is a demerit that the scanning time of the whole channel becomes longer and longer as the number of broadcasting channels increase.

SUMMARY OF THE INVENTION

The object of the present invention is to reduce the detection time of the synchronizing signal which needs much more time in the traditional method of channel scanning.

DETAILED DESCRIPTION OF THE INVENTION

Hereinafter, the channel scanning method according to the present invention is described with figures.

Figure 1:
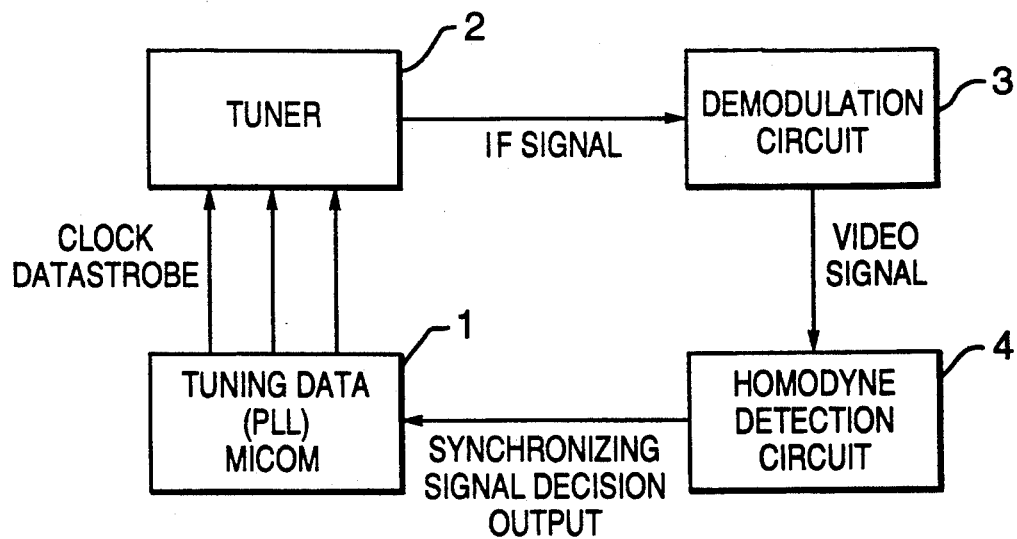
FIG. 1 is the system constitution view of the present invention.
Figure 2:
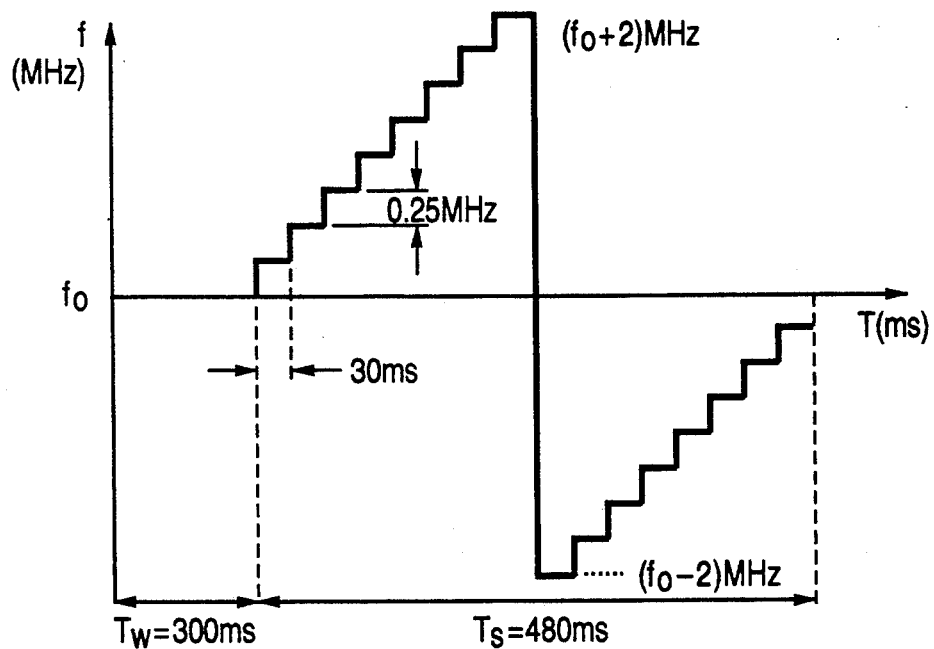
FIG. 2 is the traditional change view of the tuning frequency in a specific channel.

FIG. 1 is the system constitution view according to the present invention.

The system which realizes the present invention is made up of the micom 1, the tuner 2, the demodulation circuit 3 and the homodyne detection circuit 4.

The clock and the data with the tuning data of a specific channel is delivered to the tuner 2 in the phase locked loop system by the micom.

When this tuning data is applied to the tuner 2, a specific channel is tuned.

Then, the intermediate frequency signal(IF signal) is outputted from the tuner 2.

This IF signal is applied to the demodulation circuit 3 and is demodulated.

Accordingly, the video signal is outputted from the demodulation circuit 3 and this video signal is delivered to the homodyne detection circuit 4. Thus, the synchronizing signal which exists in the video signal is detected by the homodyne detection circuit 4. If the synchronizing signal is detected at this time, the synchronizing signal decision output according to the detection of the synchronizing signal in the homodyne detection circuit 4 is applied to the micom 1.

According to it, the specific channel in which the synchronizing signal is detected is memorized by the micom 1 and the process mentioned above is repeated using the next channel.

In the case that the synchronizing signal is not detected in the homodyne detection circuit 4, the process mentioned above is repeated with the frequency of a specific channel being increased.

Now, how much the channel scanning time is reduced by the channel scanning method according to the present invention is to be described.

Figure 3:
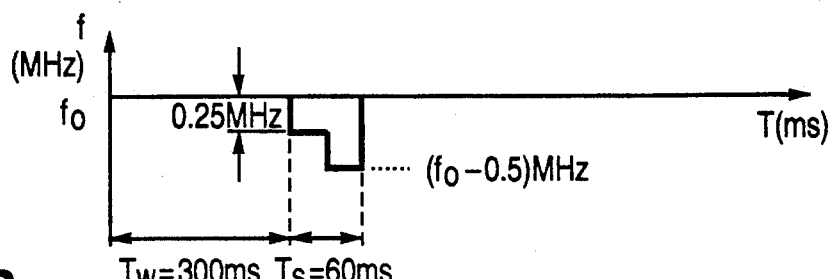
FIG. 3 is the change view of the tuning frequency of the present invention in a specific channel.

FIG. 3 is the change view of the tuning frequency to illustrate the channel scanning method according to the present invention.

The selected frequency data fo of a specific channel is transmitted to the tuner 2 by the micom 1.

If the synchronizing signal is not detected in 300 ms from that time, the frequency data is dropped to fo −0.25 MHz and the synchronizing signal is detected for 30 ms.

If the synchronizing signal is not detected at this time, the frequency data is dropped to fo −0.5 MHz again and the synchronizing signal is detected for 30 ms.

If the synchronizing signal is not detected at this time, too, the synchronizing signal of the next channel is detected.

Accordingly, the time needed to detect the synchronizing signal of one channel is 360 ms.

As mentioned above, the traditional channel scanning method detects the synchronizing signal by changing the tuning frequency to fo±2 MHz and the channel scanning method of the present invention detects the synchronizing signal by changing the tuning frequency to fo−0.5 MHz. So, the channel scanning time by the channel scanning method of the present invention becomes shorter than that of the traditional method.

Next, the reason why the frequency is altered only to fo−0.5 MHz in the channel scanning time shortening method according to the present invention is discussed.

Figure 4:
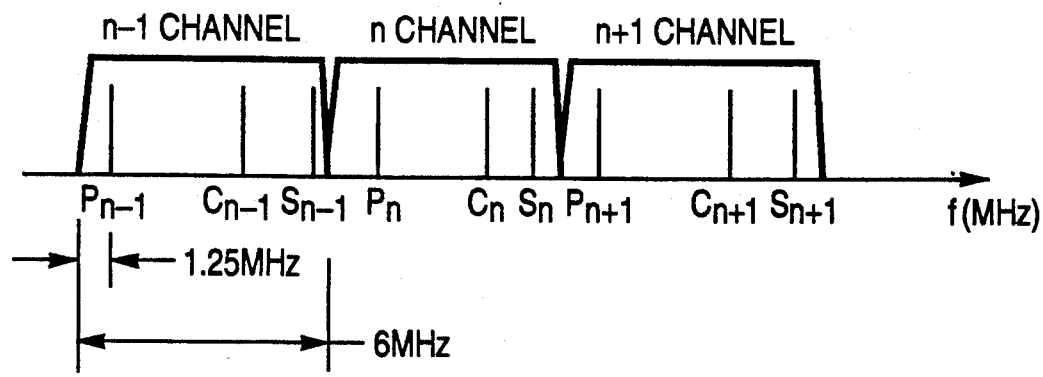
FIG. 4 is the disposition state view of the NTSC broadcasting signal.
Figure 5:
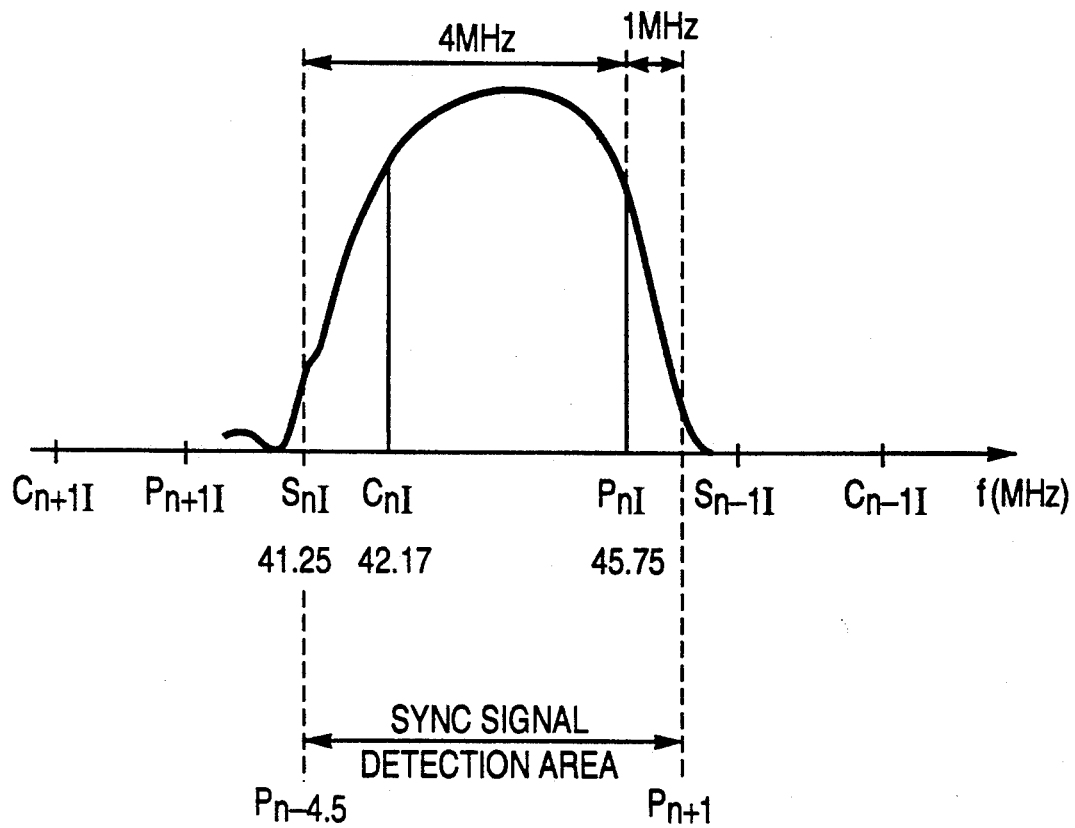
FIG. 5 is the view of the state and selectivity properties of the intermediate frequency signal when the n-channel is tuned.

FIG. 4 shows the disposition state of the frequency of the NTSC broadcasting signal and FIG. 5 shows the states and selectivity properties of the intermediate frequency signal when the n-channel is tuned.

When the IF signal is looked around on the basis of the frequency Pn(FIG. 5), the detection of the synchronizing signal is possible in the static tuning state from the frequency PnI−4 MHz to PnI+1. So, if the tuning frequency is detuned to do−0.5 MHz, the detection of the synchronizing signal from the frequency of the intermediate frequency signal PnI−4 MHz to PnI+5.1 MHZ becomes possible. This means that, from the thinking of the frequency of the broadcasting signal(RF), the detection of the synchronizing signal from the frequency Pn+4 MHz to Pn−1.5 MHz is possible. That is, the detection of the synchronizing signal from the frequency fo+4 MHz to fo−1.5 MHz is possible without execution of the automatic fine tuning(AFT). So, the detection time of the synchronizing signal consumed per a channel in an automatic program is shorted by over ½ the time from 780 ms in the traditional case to 360 ms.

Figure 6:
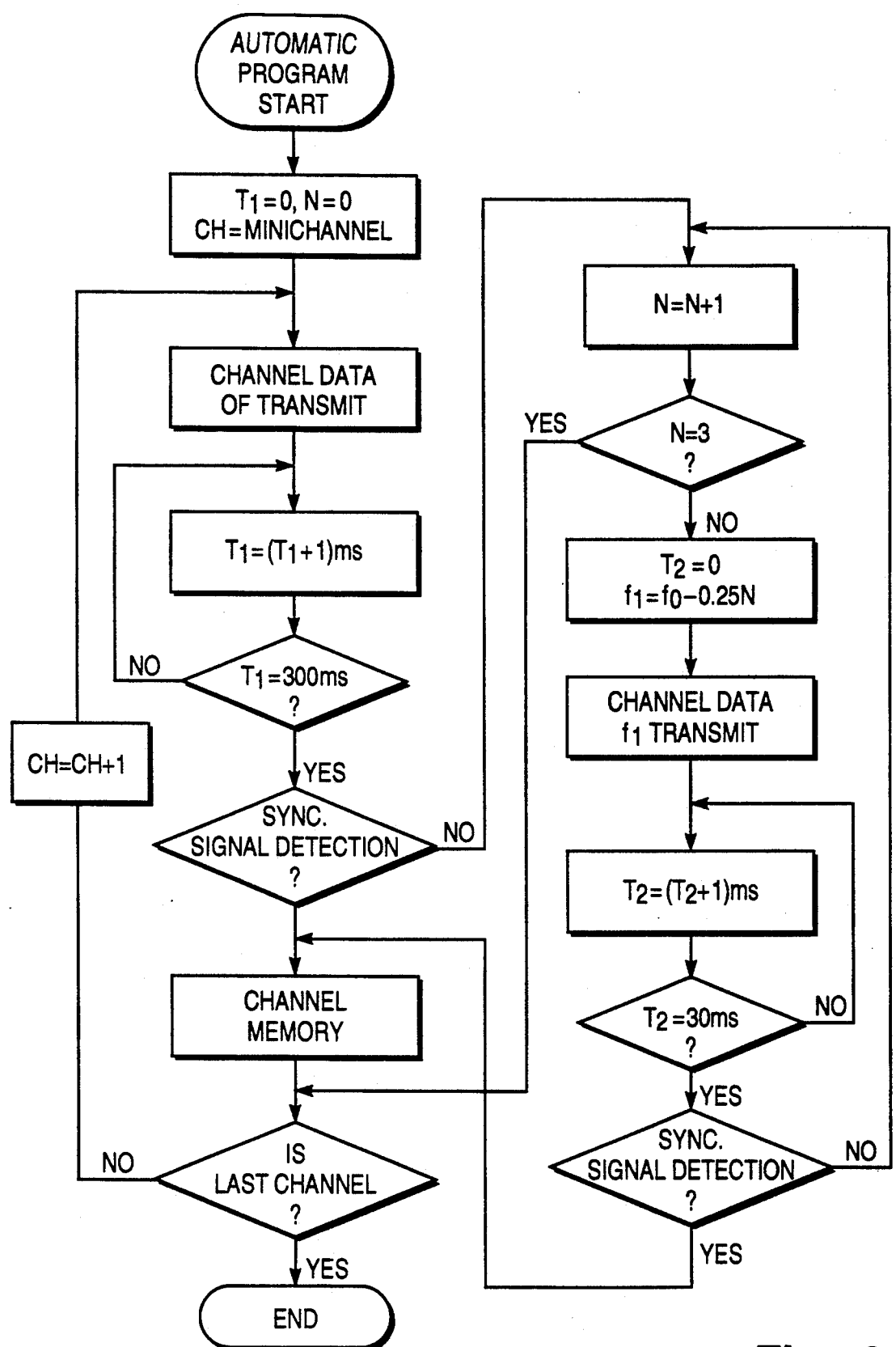
FIG. 6 is the flow chart of the present invention.

The scanning method of channel according to the present invention of which the detection time of the synchronizing signal of the channel is shortened as mentioned above is described in detail with the flow chart shown in FIG. 6.

When the automatic program is started, the frequency data of the first channel fo is transmitted to the tuner 2 by the micom 1 and the synchronizing signal is detected for 300 Ms. If the synchronizing signal is detected in 300 ms, the channel in which the synchronizing signal is detected is memorized.

Contimuously, the process mentioned above is repeated with the channel being increased and the channel in which the synchronizing signal is detected is memorized. The detection of the synchronizing signal like this is executed to the last channel.

If the synchronizing signal is not detected in 300 ms, the frequency data f1 that the tuning frequency is changed to fo−0.25 MHz is transmitted and the synchronizing signal is detected for 30 ms. If the synchronizing signal is detected at this time, the channel of that time is memorized and the operation of scanning the next channel is executed. In the case that the synchronizing signal is not detected, the frequency data that the frequency is changed to f1−0.25 MHz is transmitted again and the synchronizing signal is detected for 30 ms. If the synchronizing signal is detected at this time, too, the channel is memorized and the synchronizing signal is not detected, the channel of this time is judged as the channel where the synchronizing signal does not exist or the broadcasting signal does not exist.

If the synchronizing signal is not detected in the first 300 ms like this, the synchronizing signal is detected twice for 30 ms with the frequency being dropped 0.25 MHz. In doing so, if the synchronizing signal is not detected, it is judged as the channel where the broadcasting signal does not exist, and if the synchronizing signal is detected in the said 360 ms, the channel of that time is memorized and the synchronizing signal of the next channel is detected.

Therefore, while the detection time of the synchronizing signal of a channel in the automatic program by the traditional channel scanning method is 780 ms, that of the channel scanning method according to the present invention is 360 ms, and the scanning time of the channel can be reduced to at least one half of the scanning time.

I claim:

1. A method of scanning for a plurality of reception channels in an automatic channel program of video tape recorders and television is a homodyne detector circuit in which frequency data of a specific channel in said plurality of reception channels is transmitted from a microprocessor to a demodulator circuit via a tuner for producing video signals to be delivered to said homodyne detector circuit where a synchronizing signal is detected within a predetermined time period, and applied to a memory of said microprocessor, said method comprising the step of:

receiving frequency data of a first channel for detecting said synchronizing signal from said frequency data for said first channel using a synchronous detection process, said synchronous detection process being performed by:

scanning the first frequency data of said first channel, in a first scanning step for a first predetermined time interval, for detecting said synchronizing signal;

storing information representative of said first channel in said memory if said synchronizing signal is detected during said first scanning step;

decreasing the frequency of said frequency data by a first frequency differential, for scanning, in a second scanning step for a second predetermined time interval, for detecting said synchronizing signal if said synchronizing signal is not detected in said first scanning step;

storing information representative of said first channel in said memory if said synchronizing signal is detected during said second scanning step;

decreasing the frequency of said frequency data by a second frequency differential, for scanning in a third scanning step for a third predetermined time interval, for detecting said synchronizing signal if said synchronizing signal is not detected in said second scanning step;

storing said information representative of said first channel in said memory if said synchronizing signal is detected during said third scanning step; and scanning for a next channel of said plurality of reception channels to receive frequency data of said next channel for repeating said synchronous detection process until a last channel of said plurality of reception channels is scanned.

2. A method as claimed in claim 1, wherein said first scanning time interval for detecting said synchronizing signal of said first channel is 300 ms.

3. A method as claimed in claim 1, wherein each of said second and third predetermined time intervals for detecting said synchronizing signal of said first channel is 30 ms, and each of said first and second frequency differentials of said frequency data being decreased is 0.25 Mhz.

4. A method of scanning for a plurality of reception channels in an automatic program of a television and video cassette recorder, comprising the steps of:
   receiving frequency data of a first channel;
   scanning, in a first scanning step, at a selected frequency for detecting a synchronizing signal of said frequency data, for a first predetermined time period;
   memorizing said first channel of the detected synchronizing signal, if said synchronizing signal is detected;
   decreasing said selected frequency in two equal steps, and scanning, in a second scanning step, for said synchronizing signal at each of said two equal steps for a second predetermined time period if said synchronizing signal is not detected in said first scanning step, and memorizing said first channel if said synchronizing signal is detected in said second scanning step; and
   changing said first channel to a next channel in said plurality of reception channels for receiving frequency data of said next channel to repeat said first and second scanning steps with said first and second predetermined time periods for detecting said synchronizing signal of said next channel, said step for changing channels being repeated until frequency data of a last channel of said plurality of reception channels is received.

5. A method as claimed in claim 4, wherein said first predetermined time period is 300 ms.

6. A method as claimed in claim 4, wherein said second predetermined time period is 30 ms.

7. A method as claimed in claim 4, wherein said step of decreasing said selected frequency comprises successively decreasing said selected frequency in two equal steps of 0.25 Mhz each.

8. A method of scanning for synchronizing signals in a plurality of reception channels in an automatic program a television and video cassette recorders, comprising the steps of:
   scanning, for a first predetermined time period, at a selected frequency to detect a synchronizing signal with frequency data of a channel;
   obtaining decremented frequencies by decreasing said selected frequency in two steps, and scanning the decremented frequencies for said synchronizing signal for each step of said two steps for a second predetermined time period, if said synchronizing signal is not detected during said first predetermined time period; and
   memorizing frequency data for said channel if said synchronizing signal is detected.

9. A method as claimed in claim 8, wherein said method is repeated for each channel in said plurality of reception channels capable of being received.

10. A method as claimed in claim 9, wherein said first predetermined time period is 300 ms.

11. A method as claimed in claim 9, wherein said second predetermined time period is 30 ms.

12. A method as claimed in claim 9, wherein said step of obtaining decremented frequencies comprises decreasing said selected frequency by 0.25 Mhz in each of said two steps.

13. A device for channel scanning in an automatic channel program, comprising:
   controller means for memorizing a channel based upon a detection signal;
   tuner means for tuning to obtain a selected channel from among a plurality of channels and for converting the tuned frequency data into an intermediate-frequency signal;
   means for demodulating said intermediate-frequency signal received from said tuning means to generate a demodulated signal; and
   homodyne detection means for enabling detection of a synchronizing signal of said demodulated signal and delivering the detection signal to said controller means upon detection of said synchronizing signal, said homodyne detection means enabling detection of said synchronizing signal by scanning for said synchronizing signal for a first time period, enabling said controller means to sequentially decrease said frequency data of said selected channel two times for second and third time periods if said synchronizing signal is not detected within said first time period, and enabling said controller means to memorize frequency data of said selected channel if said synchronizing signal is detected during one of said first, second and third time periods.

14. The device of claim 13, further comprised of:
   said controller means providing decremental different tuning frequency data for each selected channel of said plurality of channels, to said tuning means; and
   said controller means automatically selecting a next channel of said plurality of channels after occurrence of a first to occur of one of said synchronizing signal during one of said first, second and third time periods and expiration of said third time period.

15. The device of claim 13, further comprised of:
   said controller means sequentially decreasing said frequency data of said selected channel two times, each time being 0.25 MHz.

16. The device of claim 15, further comprised of:
   said controller means decrementally changing said tuning frequency data for each selected channel of said plurality of channels, to said tuner means; and
   said controller means automatically selecting a next channel of said plurality of channels after occurrence of a first to occur of one of said synchronizing signal during one of said first, second and third time periods and expiration of said third time period, and enabling said tuner means to sequentially tune in for a next channel of said plurality of channels until a last channel of said plurality of channels is tuned.

17. The device of claim 13, wherein said first time period is 300 ms, and said second and third time period is 30 ms each.

* * * * *

UNITED STATES PATENT AND TRADEMARK OFFICE
CERTIFICATE OF CORRECTION

PATENT NO. : 5,299,011
DATED : March 29, 1994
INVENTOR(S) : Sung-Gyu Choi

It is certified that error appears in the above-indentified patent and that said Letters Patent is hereby corrected as shown below:

IN THE TITLE PAGE

Inventor, [75], Change "Sung G. Choi" to --Sung-Gyu Choi-- .

Column 3, Line 24, Change "5.1" to --1.5-- ;

Line 33, Change "shorted" to --shortened-- ;

Line 47, Change "Contimuously" to --Continuously-- .

Column 4, Line 18, Change "television" to --televisions--, Change "is" to --in-- .

Signed and Sealed this

Seventh Day of March, 1995

Attest:

BRUCE LEHMAN

*Attesting Officer*  *Commissioner of Patents and Trademarks*